(12) United States Patent
Matsui

(10) Patent No.: US 11,282,674 B2
(45) Date of Patent: Mar. 22, 2022

(54) CHARGED PARTICLE BEAM WRITING METHOD AND CHARGED PARTICLE BEAM WRITING APPARATUS

(71) Applicant: NuFlare Technology, Inc., Yokohama (JP)

(72) Inventor: Hideki Matsui, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/798,551

(22) Filed: Feb. 24, 2020

(65) Prior Publication Data

US 2020/0273666 A1 Aug. 27, 2020

(30) Foreign Application Priority Data

Feb. 27, 2019 (JP) .............................. JP2019-034559

(51) Int. Cl.
  *H01J 37/00* (2006.01)
  *H01J 37/317* (2006.01)
  *H01J 37/20* (2006.01)
(52) U.S. Cl.
  CPC .......... *H01J 37/3174* (2013.01); *H01J 37/20* (2013.01); *H01J 2237/202* (2013.01)
(58) Field of Classification Search
  USPC ..................................................... 250/492.3
  See application file for complete search history.

(56) References Cited

U.S. PATENT DOCUMENTS

| 6,566,662 | B1 * | 5/2003 | Murakami | ............. | B82Y 10/00 |
| | | | | | 250/398 |
| 9,063,440 | B2 * | 6/2015 | Kato | ....................... | B82Y 10/00 |
| 9,153,420 | B2 * | 10/2015 | Yashima | ............. | H01J 37/3026 |

(Continued)

FOREIGN PATENT DOCUMENTS

| JP | 10-261557 A | 9/1998 |
| JP | 2005-33078 A | 2/2005 |

(Continued)

OTHER PUBLICATIONS

Combined Taiwanese Office Action and Search Report dated Dec. 30, 2020 in Taiwanese Patent Application No. 109102962 (with English translation of Office Action), 8 pages.

*Primary Examiner* — Phillip A Johnston
(74) *Attorney, Agent, or Firm* — Oblon, McClelland, Maier & Neustadt, L.L.P.

(57) ABSTRACT

In one embodiment, a charged particle beam writing method is for writing a pattern in a writing area on a substrate by irradiating a charged particle beam onto the substrate while moving the substrate to write stripes sequentially, each of the stripes having a width W and shapes obtained by dividing the writing area by the width W. The method includes performing S times (S is an integer greater than or equal to two) strokes, each of the strokes which is a process writing the stripes in a multiplicity of 2n (n is an integer greater than or equal to one) while shifting a reference point of each of the stripes in the width direction by a preset stripe shift amount and changing a moving direction of the substrate for each of the stripes, and writing while the reference point of the stripes in the each of the strokes in the width direction of the stripes is shifted by a preset stroke shift amount in each of the strokes.

6 Claims, 11 Drawing Sheets

(56) References Cited

U.S. PATENT DOCUMENTS 9,218,942 B2 * 12/2015 Matsumoto ......... H01J 37/3026
2008/0105827 A1 5/2008 Tamamushi
2018/0005799 A1 1/2018 Hasegawa et al.

FOREIGN PATENT DOCUMENTS

| JP | 2008-117871 A | 5/2008 |
| JP | 2012-4413 A | 1/2012 |
| JP | 2012-43972 A | 3/2012 |

* cited by examiner

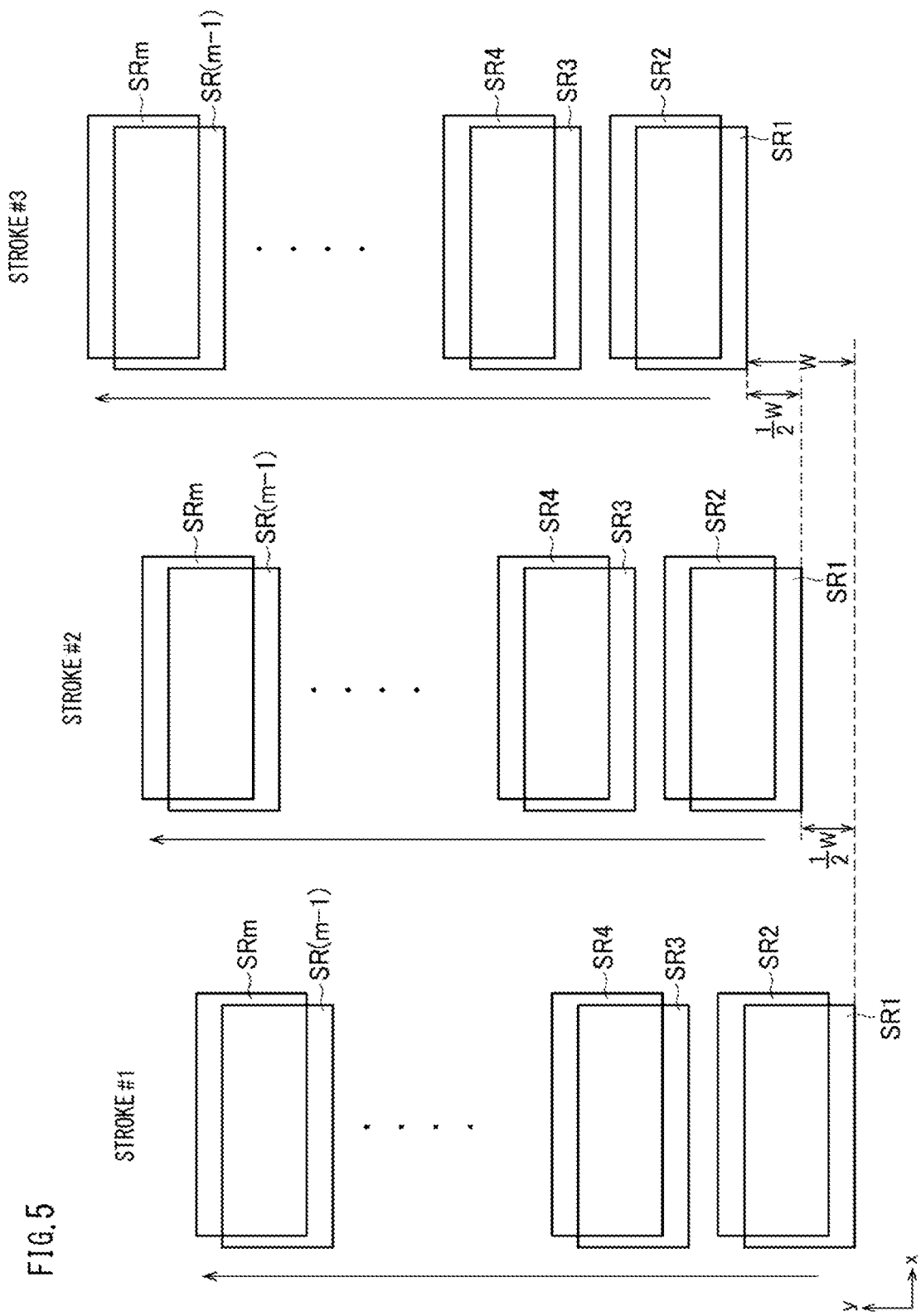

|  | | STROKE | | | | |
|---|---|---|---|---|---|---|
|  | | #1 | #2 | #3 | ... | #(N−1) |
| STRIPE | SR1 | 0 | $\frac{2}{N} \cdot W$ | $\frac{4}{N} \cdot W$ | | $\frac{2(N-2)}{N} \cdot W$ |
| | SR2 | $\frac{1}{N} \cdot W$ | $\frac{3}{N} \cdot W$ | $\frac{5}{N} \cdot W$ | | $\frac{2(N-2)+1}{N} \cdot W$ |
| | SR3 | $\frac{2(N-2)+2}{N} \cdot W$ | ... | ... | | ... |
| | SR4 | ... | ... | ... | | ... |
| | ⋮ | ... | ... | ... | | ... |

FIG.15A
FIG.15B
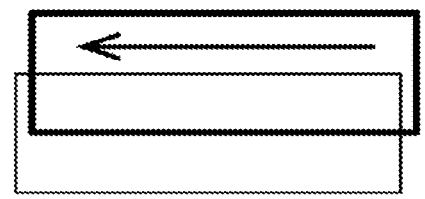
FIG.15D
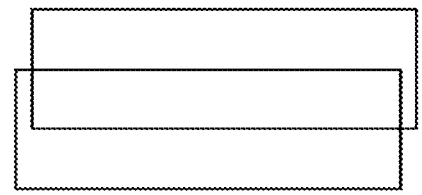
FIG.15C
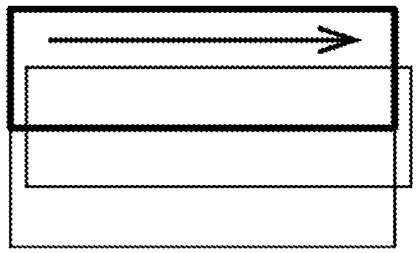
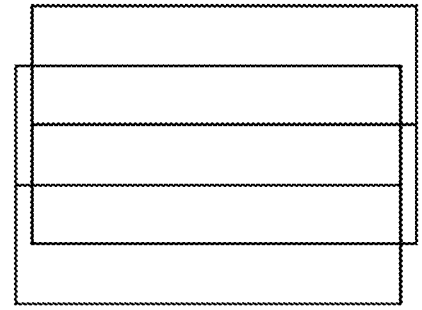

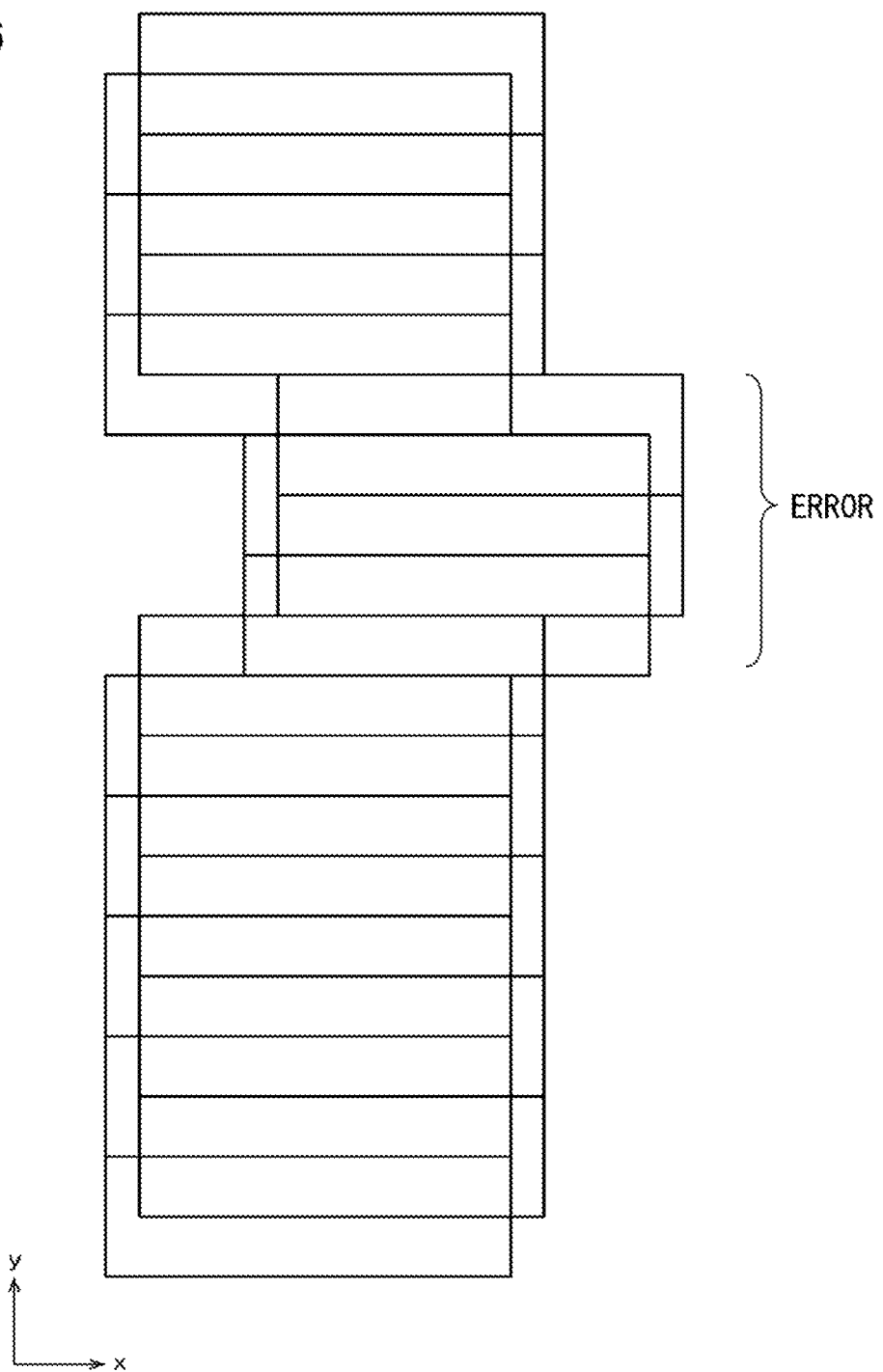

CHARGED PARTICLE BEAM WRITING METHOD AND CHARGED PARTICLE BEAM WRITING APPARATUS

CROSS REFERENCE TO RELATED APPLICATION

This application is based upon and claims benefit of priority from the Japanese Patent Application No. 2019-034559, filed on Feb. 27, 2019, the entire contents of which are incorporated herein by reference.

FIELD

The present invention relates to a charged particle beam writing method and a charged particle beam writing apparatus.

BACKGROUND

With wafer-scale integration of LSIs, the circuit line widths of semiconductor devices have become finer and finer. As a method of forming exposure masks (also referred to as reticles when used in steppers or scanners) for forming circuit patterns onto these semiconductor devices, an electron beam writing technology having an excellent resolution is used.

A charged particle beam writing apparatus employing a variably shaping system is known as one of the electron beam writing apparatus. In a writing apparatus provided with the variable shaping system, a pattern is written on a substrate located on a movable stage with an electron beam shaped by passing through an opening of a first shaping aperture and an opening of a second shaping aperture.

In an electron beam writing apparatus, design data to be inputted to the apparatus is converted to writing data for writing onto a substrate with an electron beam. Writing data is split into strip shapes called stripes. Each stripe is written with a shot that is a unit of writing. The shot is controlled in its position with a main deflector and a sub-deflector. The width of each stripe is predetermined by a width of a main deflection region.

There has been a possibility that connection accuracy of a pattern to be written at a boundary portion between stripes or position accuracy of a pattern to be written deteriorates because of deflection distortion of the main deflector. As a technique for improving the connection accuracy or position accuracy of a pattern, a multiple writing method is known where a pattern is written repeatedly multiple times while shifting stripes.

FIG. 13 shows an example of a writing process for multiple writing. As shown in FIG. 13, a pattern is written in each stripe by forward (FWD) writing in which the writing process advances in +x direction, and the first writing is performed on the entire surface of a writing area of a substrate. Hereinafter, writing of the entire surface of the writing area once is referred to as one-stroke writing. After the first-stroke writing process, the stripes are shifted in a y direction and FWD writing is performed, whereby the second-stroke writing process is performed.

As shown in FIG. 13, in the case of a FWD-FWD mode in which the direction of travel of writing is constantly +x direction, a stage position is returned after one stripe is written in order to write the next stripe, with the result that a stage moving time becomes long. For this reason, a long time is required for writing.

In contrast, a FWD-BWD mode shown in FIG. 14 requires a writing time shorter than the FWD-FWD mode. In the FWD-BWD mode, FWD writing in which the writing process advances in +x direction and backward (BWD) writing in which the writing process advances in −x direction are alternately performed in units of stripes.

As shown in FIG. 14, when the first stroke and the second stroke are processed in the FWD-BWD mode, the writing area mixedly contains a region R101 in which FWD writing is performed in the first stroke and BWD writing is performed in the second stroke, a region R102 in which BWD writing is performed in both the first stroke and the second stroke, a region R103 in which BWD writing is performed in the first stroke and FWD writing is performed in the second stroke, and a region R104 in which FWD writing is performed in both the first stroke and the second stroke. This interferes with improvement in writing accuracy.

As shown in FIG. 15A to FIG. 15D, in a method of performing multiple writing in the FWD-BWD mode while shifting by a width smaller than the stripe width in the y direction, a stage moving time can be shortened as compared to the FWD-FWD mode. In addition, since writing is completed by one stroke, a stage moving time between strokes as in the case of the technique shown in FIG. 14 is not required, and throughput is also improved.

In an electron beam writing apparatus, a beam position is adjusted by performing drift correction periodically. However, an error occurs in a random component in rare cases and, as a result, an adjusted beam position deviates. The beam position is corrected to an accurate position through the next drift correction. In multiple writing in a plurality of strokes such as shown in FIG. 13 and FIG. 14, even when a deviation occurs in a writing position in one stroke, a pattern is written at a correct position in another stroke, so that the influence of deviation can be reduced.

However, the technique shown in FIG. 15A to FIG. 15D preforms writing with only one stroke. Accordingly, when a deviation occurs in a writing position, influence directly appears in writing accuracy as shown in FIG. 16. In this way, the technique shown in FIG. 15A to FIG. 15D leads to significant decrease in writing accuracy in the case where a time-dependent random deviation occurs.

BRIEF DESCRIPTION OF THE DRAWINGS

FIG. 5 is a conceptual view that illustrates an example of writing operation.

FIGS. 15A to 15D are conceptual views that illustrate an example of writing operation.

FIG. 16 is a view that shows an example of a written result in the case where an error has occurred.

DETAILED DESCRIPTION

In one embodiment, a charged particle beam writing method is for writing a pattern in a writing area on a substrate by irradiating a charged particle beam onto the substrate while moving the substrate to write stripes sequentially, each of the stripes having a width W and shapes obtained by dividing the writing area by the width W. The method includes performing S times (S is an integer greater than or equal to two) strokes, each of the strokes which is a process writing the stripes in a multiplicity of 2n (n is an integer greater than or equal to one) while shifting a reference point of each of the stripes in the width direction by a preset stripe shift amount and changing a moving direction of the substrate for each of the stripes, and writing while the reference point of the stripes in the each of the strokes in the width direction of the stripes is shifted by a preset stroke shift amount in each of the strokes.

An embodiment of the present invention will be described below with reference to the drawings. In the embodiment, a configuration using an electron beam as an example of a charged particle beam will be described. The charged particle beam is not limited to the electron beam. For example, the charged particle beam may be an ion beam.

Figure 1:
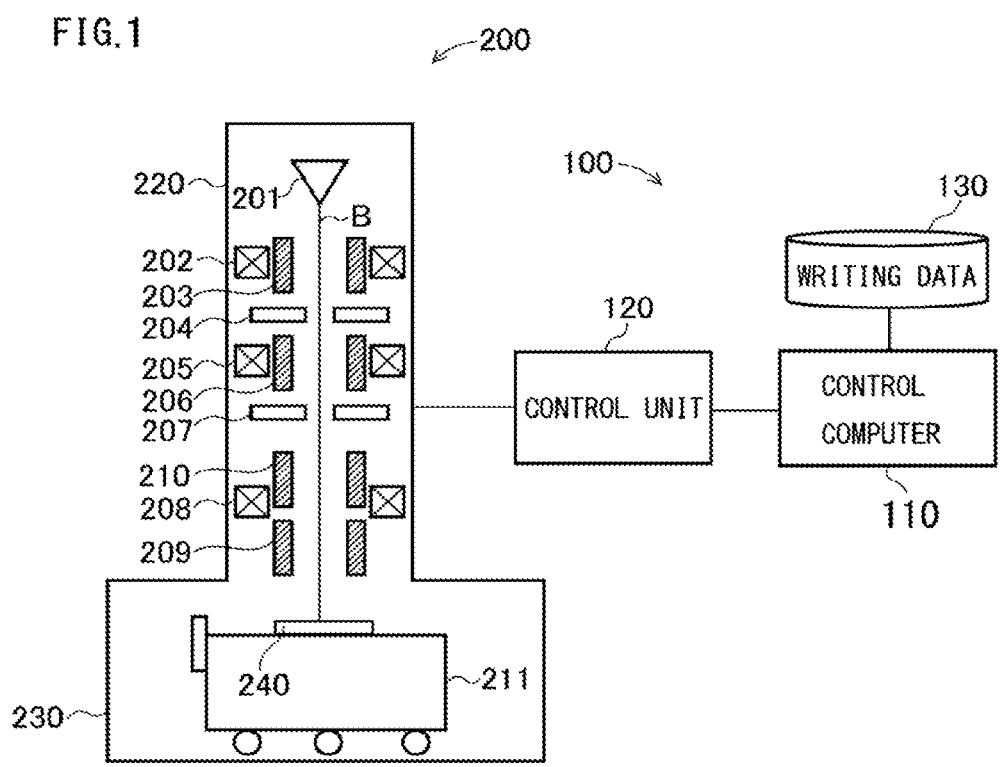
FIG. 1 is a schematic configuration diagram of a writing apparatus according to an embodiment of the present invention.

FIG. 1 is a schematic diagram of an electron beam writing apparatus according to an embodiment of the present invention. The electron beam writing apparatus shown in FIG. 1 is provided with a variably shaping unit, and includes a control unit 100 and a writing unit 200.

The writing unit 200 includes an electron lens column 220 and a writing chamber 230. In the electron lens column 220, an electron gun 201, a illuminating lens 202, a blanker 203, a first shaping aperture 204, a projection lens 205, a shaping deflector 206, a second shaping aperture 207, an objective lens 208, a main deflector 209, and a sub-deflector 210 are arranged.

In the writing chamber 230, an XY stage 211 is located. A substrate 240 to be written is mounted on the XY stage 211.

An electron beam B emitted from the electron gun 201 (emission unit) provided in the electron lens column 220 is switched between being and not being irradiated to the substrate by the blanker (blanking deflector) 203 that switches the beam passing and not passing through the blanker 203.

Figure 2:
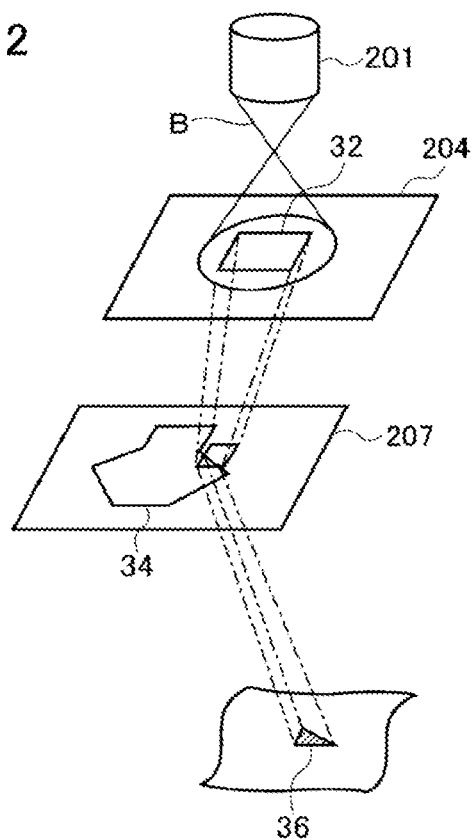
FIG. 2 is a diagram that shows an example of beam shaping.

The electron beam B is irradiated by the illuminating lens 202 to the entire first shaping aperture 204 having a rectangular opening 32 (see FIG. 2). The electron beam B is shaped into a rectangular shape as a result of passing through the opening 32 of the first shaping aperture 204.

The electron beam B having passed through the first shaping aperture 204 to have a first aperture image is projected by the projection lens 205 onto the second shaping aperture 207 having a variably shaping opening 34 (see FIG. 2). At this time, the deflector 206 controls deflection of the electron beam having the first aperture image to be projected onto the second shaping aperture 207, so that the shape and sizes of the electron beam that has passed through the variably shaping opening 34 can be changed (variably shaped).

The electron beam B having passed through the variably shaping opening 34 of the second shaping aperture 207 to have a second aperture image is brought into focus with the objective lens 208. The beam is then deflected by the main deflector 209 and the sub-deflector 210, and irradiated to the substrate 240 mounted on the XY stage 211 that moves continuously.

FIG. 2 is a schematic diagram for illustrating beam shaping by the first shaping aperture 204 and the second shaping aperture 207. The rectangular opening 32 for shaping the electron beam B is formed in the first shaping aperture 204.

The variably shaping opening 34 of the second shaping aperture 207 shapes the electron beam B having passed through the opening 32 of the first shaping aperture 204 into a desired shape. A pattern 36 in the shape of the beam having passed through both the opening 32 of the first shaping aperture 204 and the variably shaping opening 34 of the second shaping aperture 207 is written in a writing area of the substrate 240 mounted on the XY stage 211 that moves continuously.

As shown in FIG. 1, the control unit (controller) 100 includes a control computer 110, a control unit (controller) 120, and a storage unit 130. Writing data that is layout data is inputted from an outside and stored in the storage unit 130.

The control computer 110 reads writing data from the storage unit 130 and generates shot data by executing multistage data conversion process. The shot data contains information, such as shot shape, shot size, and shot position.

The control unit 120 controls the deflection amounts of the blanker 203, deflector 206, main deflector 209, and sub-deflector 210, the moving speed of the XY stage 211, and the like, by using the generated shot data and executes writing process. The control unit 120 controls the deflection amounts of the main deflector 209 and sub-deflector 210 based on the shot position contained in the shot data.

Figure 3:
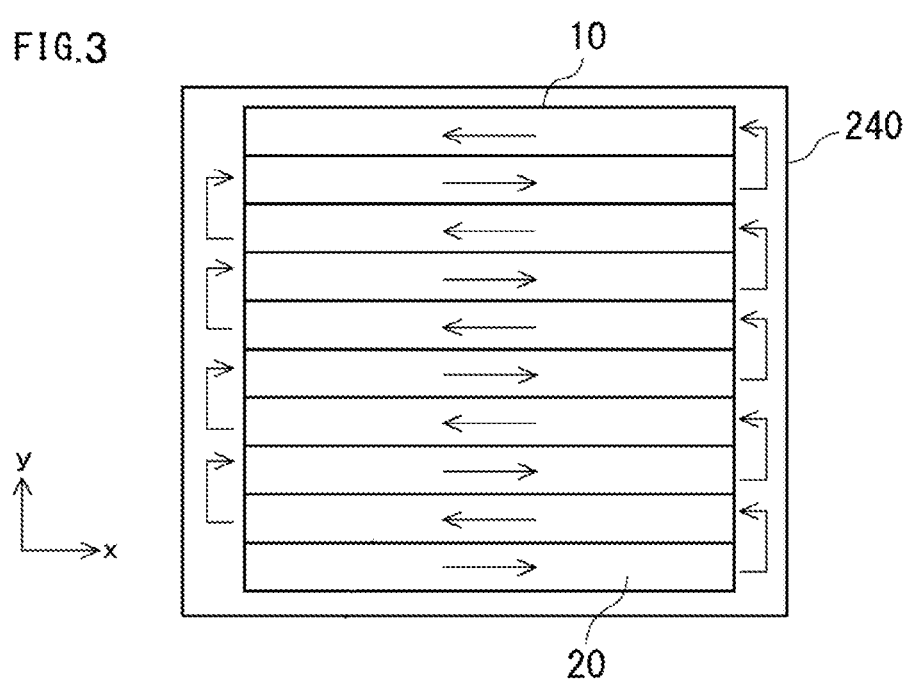
FIG. 3 is a conceptual view that illustrates an example of writing operation.

As shown in FIG. 3, in the electron beam writing apparatus, a writing area 10 of the substrate 240 is imaginarily divided into a plurality of strip-shaped stripe regions 20, and writing is performed in units of stripe region. The width of each of stripe regions 20 is slightly smaller than a width deflectable by the main deflector 209. While the XY stage 211 is continuously moved in the x direction, the electron beam B is irradiated to one of the stripe regions 20. The main deflector 209 causes the shot position of the electron beam B to follow movement of the XY stage 211. Once the one of the stripe regions 20 has been written, the XY stage 105 is step-fed in the y direction and performs writing operation for the next stripe region 20 in the x direction (for example, reverse direction this time). By advancing the XY stage 211 such that the writing operations for the stripe regions 20 meander, the moving time of the XY stage 211 can be shortened.

The electron beam writing apparatus performs multiple writing for repeatedly writing a pattern multiple times in order to improve the connection accuracy of a pattern to be written at the boundary portion between the stripe regions 20 or the position accuracy of a pattern to be written.

In the present embodiment, writing is performed by the FWD-BWD mode in which forward (FWD) writing and backward (BWD) writing are alternately performed in units of stripe. In the FWD writing, the writing process advances in +x direction. In the backward (BWD) writing, the writing process advances in −x direction. In the present embodiment, a shift width of stripes in the y direction (stripe width direction) includes at least two types, that is, a first shift width smaller than the stripe width and a second shift width larger than the stripe width.

When writing the (substantially) entire surface of the writing area 10 of the substrate 240 while shifting the stripes in the y direction is defined as one-stroke writing, multiple-stroke writing is performed while the position of the stripes (writing start position) are changed in each stroke.

Figure 4A:
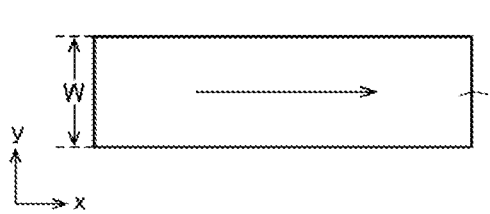
FIG. 4A to FIG. 4D are conceptual views that illustrate examples of writing operation.
Figure 4B:
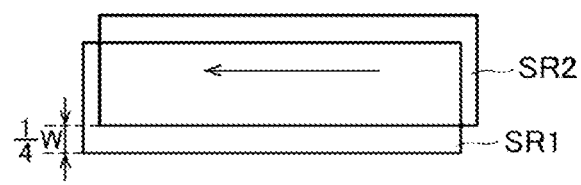

FIGS. 4A, 4B, 4C, 4D and FIG. 5 show an example of multiple writing having a multiplicity of four. In this example, as shown in FIG. 4A, FWD writing is performed over the first stripe SR1. The stripe width is denoted by W. Subsequently, a shift of W/4 (<W) is made in the y direction as shown in FIG. 4B, and BWD writing is performed on the second stripe SR2.

Figure 4C:
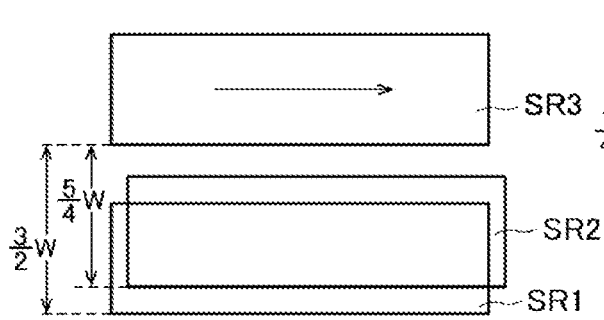

Subsequently, a shift of 5W/4 (≥W) is made in the y direction as shown in FIG. 4C, and FWD writing is performed on the third stripe SR3. The stripe SR3 deviates from the stripe SR1 by 3W/2 in the y direction.

Figure 4D:
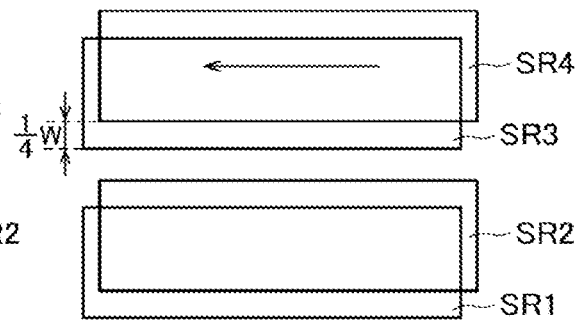

Subsequently, a shift of W/4 (<W) is made in the y direction as shown in FIG. 4D, and BWD writing is performed on the fourth stripe SR4.

By repeating the processes shown in FIG. 4A to FIG. 4D, writing of the first stroke #1 is performed as shown in FIG. 5.

Subsequently, the positions of the stripes of the stroke #1 are shifted by W/2 in the y direction, and writing of the second stroke #2 is performed. Subsequent to writing of the second stroke #2, the positions of the stripes of the stroke #2 are shifted by W/2 in the y direction, and writing of the third stroke #3 is performed.

Figure 6:
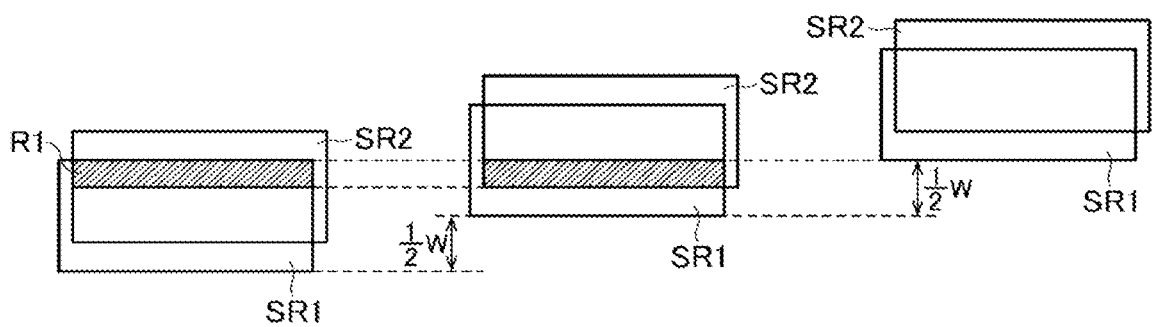
FIG. 6 is a view that illustrates the multiplicity of writing.

In this example, an upper end-side region R1 (width W/4) of the stripe SR1 of the stroke #1 is contained in the stripes SR1 and SR2 of the stroke #1 and the stripes SR1 and SR2 of the stroke #2 as shown in FIG. 6. Therefore, FWD writing and BWD writing each are performed twice, and the multiplicity is four.

Figure 7:
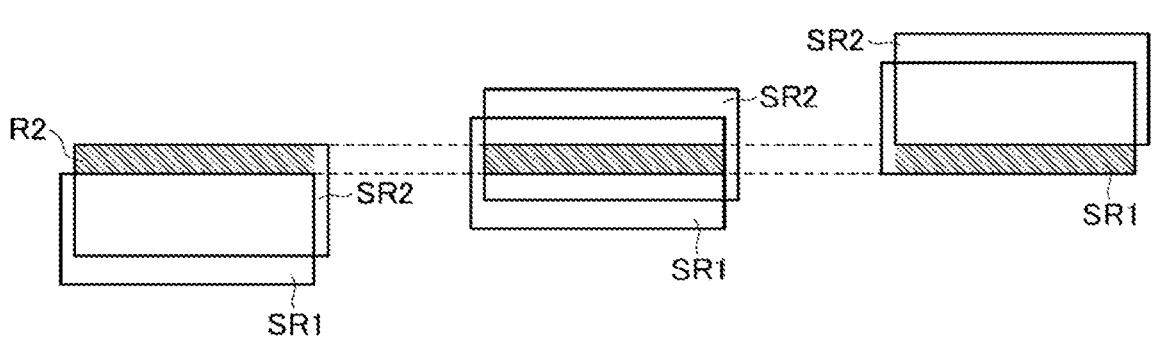
FIG. 7 is a view that illustrates the multiplicity of writing.

As shown in FIG. 7, an upper end-side region R2 (width W/4) of the stripe SR2 of the stroke #1 is contained in the stripe SR2 of the stroke #1, the stripes SR1 and SR2 of the stroke #2, and the stripe SR1 of the stroke #3. Therefore, FWD writing and BWD writing each are performed twice, and the multiplicity is four.

Figure 8:
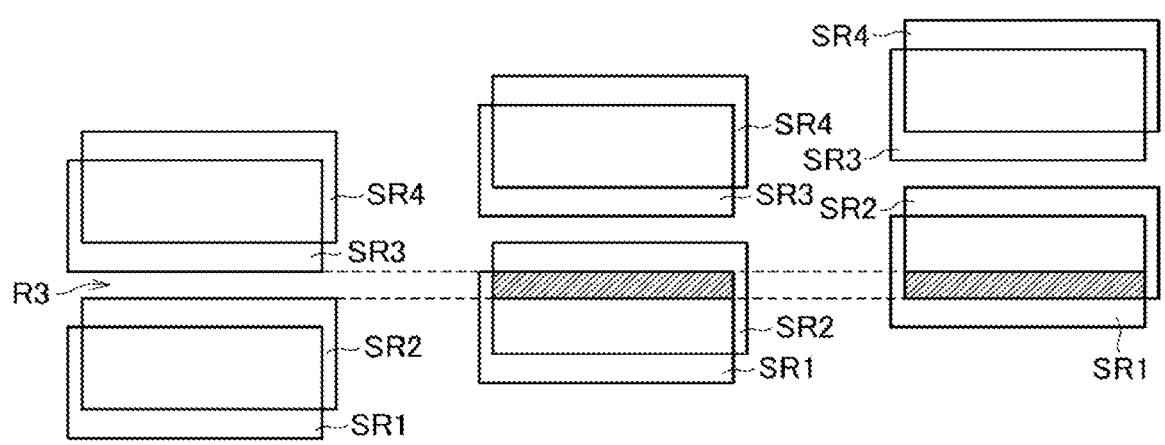
FIG. 8 is a view that illustrates the multiplicity of writing.

As shown in FIG. 8, a region R3 (width W/4) between an upper end of the stripe SR2 and lower end of the stripe SR3 in the stroke #1 is contained in the stripes SR1 and SR2 of the stroke #2 and the stripes SR1 and SR2 of the stroke #3. Therefore, FWD writing and BWD writing each are performed twice, and the multiplicity is four.

The regions have the same multiplicity and also have the same numbers of times of FWD writing and BWD writing.

Since writing is performed in the FWD-BWD mode, the stage moving time can be shortened as compared to the FWD-FWD mode. In addition, since the number of times of FWD writing and the number of times of BWD writing can be made equal among the regions, writing accuracy can be improved as compared to when the numbers are different.

Since writing is performed in a plurality of strokes, the influence of time-dependent deviation, such as an error due to a random component at the time of drift correction, can be reduced.

In this way, according to the present embodiment, while a decrease in throughput is suppressed, writing accuracy can be improved with multiple writing.

In the above-described embodiment, an example in which multiple writing having a multiplicity of four is implemented by setting a multiplicity per one stroke to two and performing writing in three strokes. Alternatively, multiple writing having various multiplicities may be performed by changing the multiplicity per one stroke or the number of strokes. For example, multiple writing having a multiplicity of N (N is an integer greater than or equal to three) is performed by setting the multiplicity per one stroke to 2n (n is an integer greater than or equal to one) and setting the number of strokes S to N−(2n−1).

Figures 9, 10:
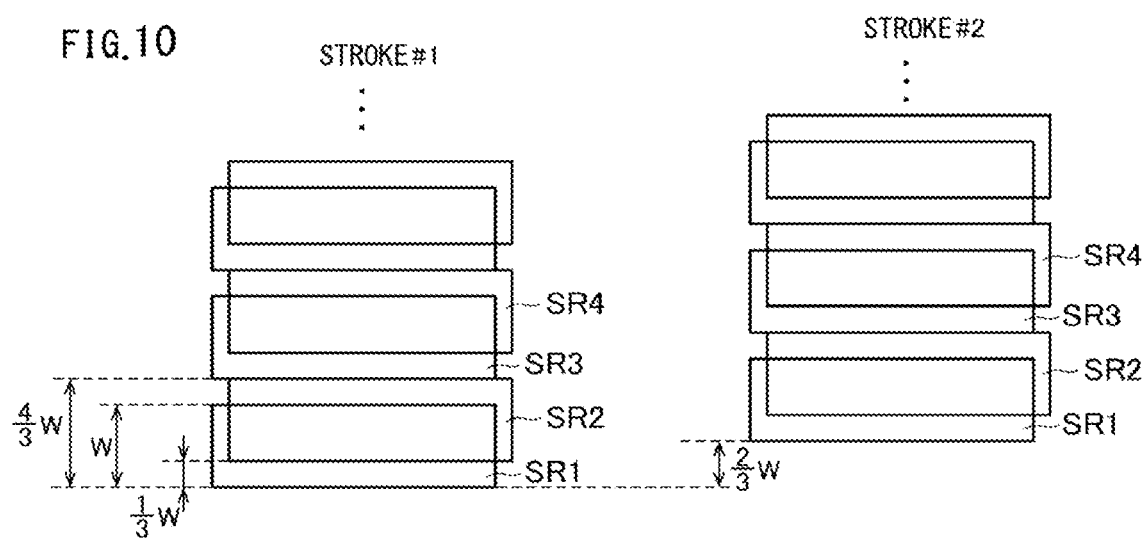
FIG. 9 is a table that shows the positions of stripes.
FIG. 10 is a conceptual view that illustrates an example of writing operation.

In an example where n=1, that is, the multiplicity per one stroke is set to two, writing of (N−1) strokes is performed in order to implement multiple writing having a multiplicity of N. The positions of the reference points of the stripes in each stroke are shown in FIG. 9. Here, the reference point of each stripe is defined as the lower left vertex in the drawing, and the position is represented by y coordinate. The position of the reference point of the first stripe SR1 of the stroke #1 is set to zero. W is the width of each stripe.

FIG. 10 shows an example in which multiple writing having a multiplicity of N=3 is performed by setting a multiplicity per one stroke to two.

In the first stroke #1, after the first stripe SR1 is written, a shift of W/3 (=W/N) is made in the y direction, and the second stripe SR2 is written. Subsequently, the third stripe SR3 is written such that the reference point becomes 4W/3. In the second stroke #2, the first stripe SR1 is written in such a manner that the reference point is 2W/3.

Figure 11:
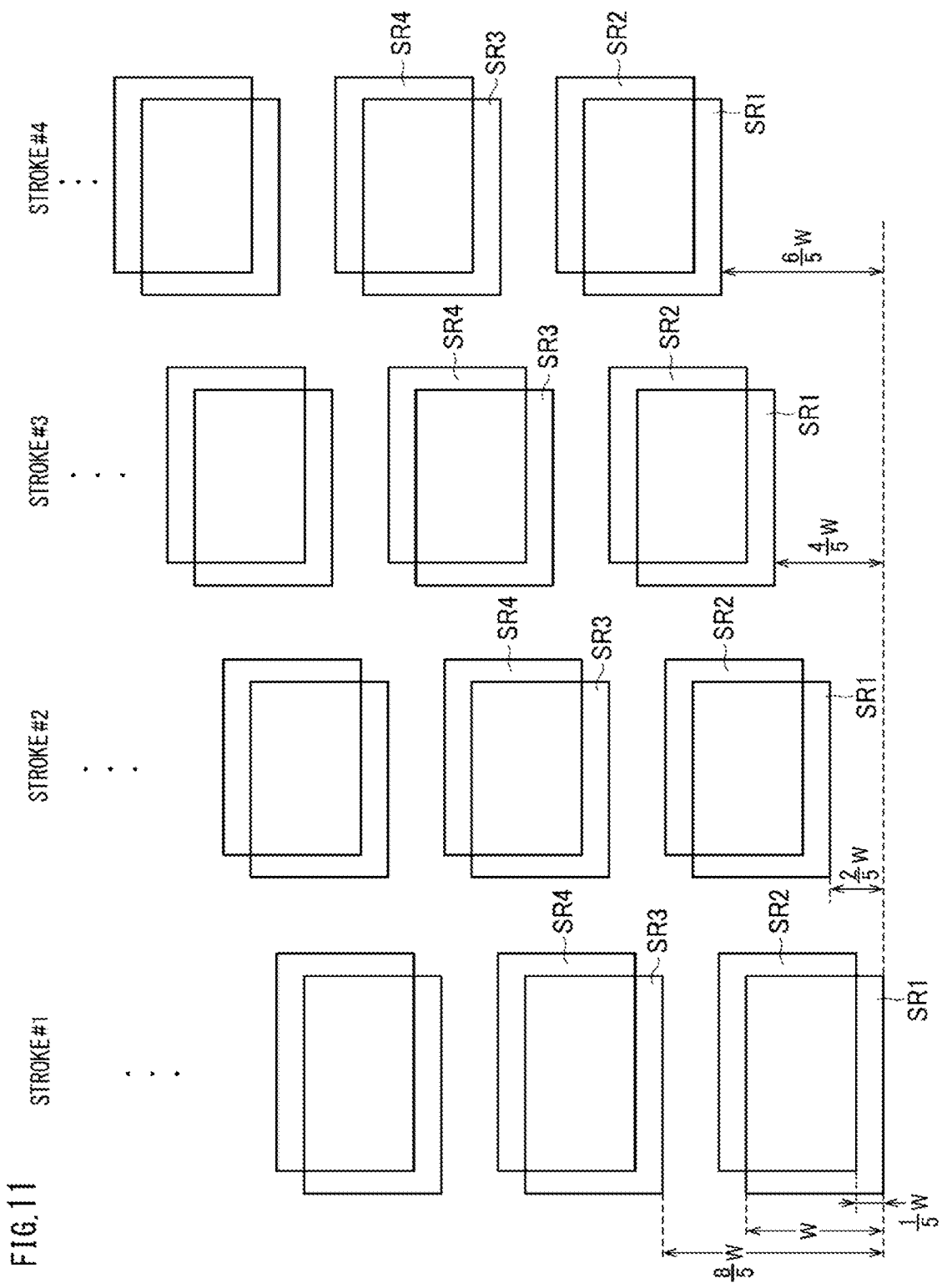
FIG. 11 is a conceptual view that illustrates an example of writing operation.

FIG. 11 shows an example in which multiple writing having a multiplicity of N=5 is performed while the multiplicity per one stroke is set to two.

In the first stroke #1, after the first stripe SR1 is written, a shift of W/5 (=W/N) is made in the y direction, and the second stripe SR2 is written. Subsequently, the third stripe SR3 is written in such a manner that the reference point is 8W/5. In the second stroke #2, the first stripe SR1 is written in such a manner that the reference point is 2W/5. In the third stroke #3, the first stripe SR1 is written in such a manner that the reference point is 4W/5. In the fourth stroke #4, the first stripe SR1 is written in such a manner that the reference point is 6W/5.

Figure 12:
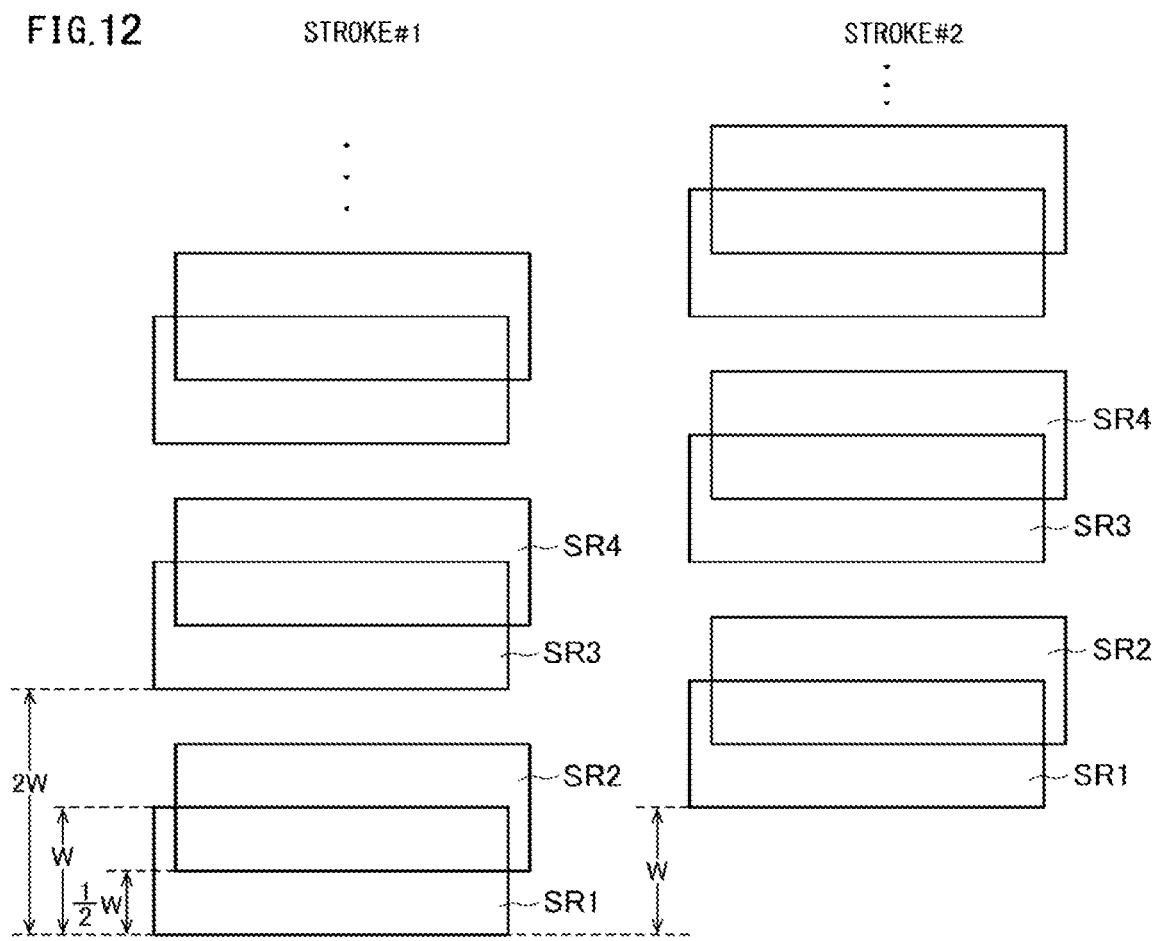
FIG. 12 is a conceptual view that illustrates an example of writing operation.
Figure 13:
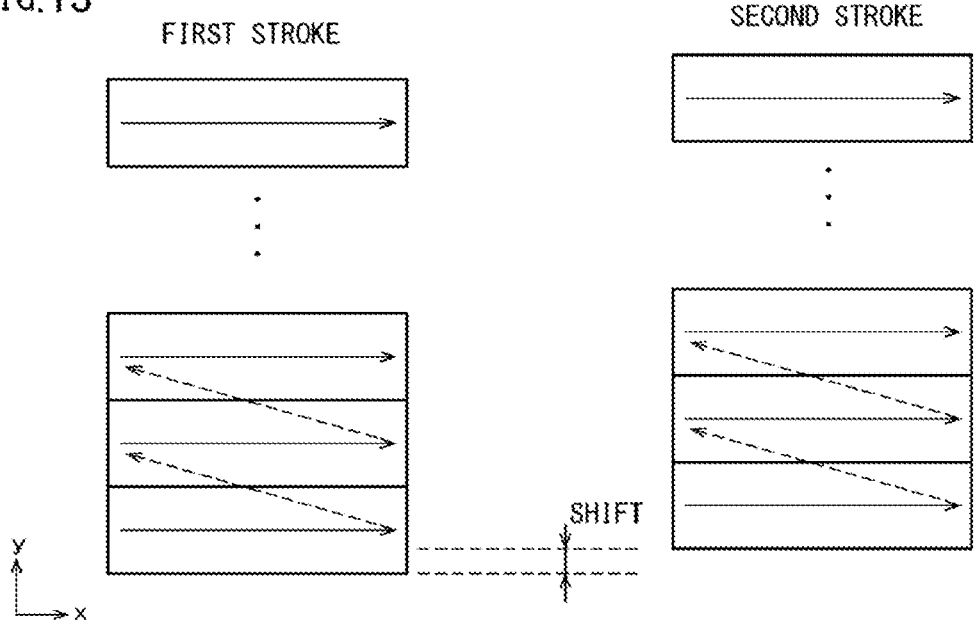
FIG. 13 is a conceptual view that illustrates an example of writing operation.
Figure 14:
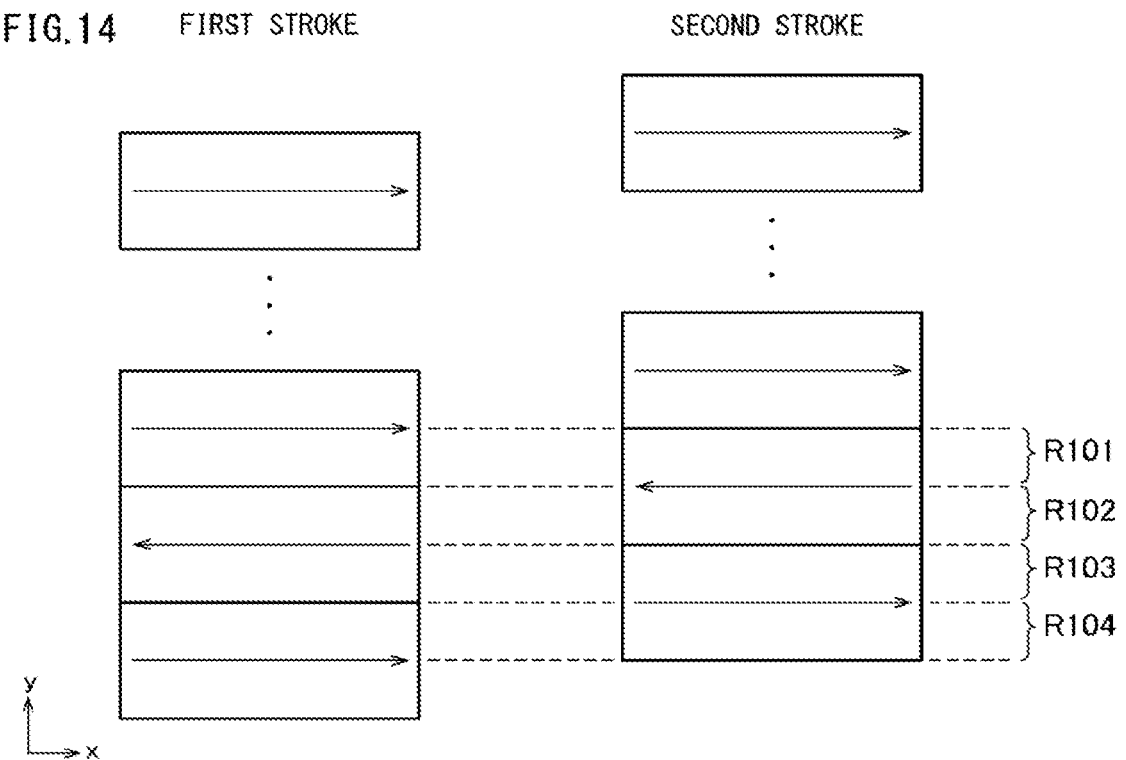
FIG. 14 is a conceptual view that illustrates an example of writing operation.

FIG. 12 shows an example in which the multiplicity per one stroke is set to two and multiple writing having a multiplicity of two is performed in two strokes. In the first stroke #1, after the first stripe SR1 is written, a shift of W/2 is made in the y direction, and the second stripe SR2 is written. Subsequently, the third stripe SR3 is written in such a manner that the reference point is 2W. In the second stroke #2, the first stripe SR1 is written in such a manner that the reference point is W.

In the above-described embodiment, the configuration using electron beam is described as one example of charged particle beam; however, charged particle beam is not limited to electron beam and may be another charged particle beam, such as ion beam.

In the above-described embodiment, an example of a writing apparatus using single beam is described; however, it is also applicable to a writing apparatus using multi-beam.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam writing method of writing a pattern in a writing area on a substrate by irradiating a charged particle beam onto the substrate while moving the substrate to write stripes sequentially, each of the stripes having a width W and shapes obtained by dividing the writing area by the width W, comprising:

performing S times (S is an integer greater than or equal to two) strokes, each of the strokes which is a process writing the stripes in a multiplicity of 2n (n is an integer greater than or equal to one) while shifting a reference point of each of the stripes in the width direction by a preset stripe shift amount and changing a moving direction of the substrate for each of the stripes; and writing while the reference point of the stripes in the each of the strokes in the width direction of the stripes is shifted by a preset stroke shift amount in each of the strokes, wherein, when a pattern is written at a multiplicity of N (N is an integer greater than or equal to 2n+1), S is represented by S=N−(2n−1).

2. The method according to claim 1, wherein when n=1, the preset stripe shift amount after writing a kth (k is an odd number greater than or equal to 1) stripe is less than the stripe width W, and the preset stripe shift amount after writing a (k+1)th stripe is greater than or equal to W.

3. The method according to claim 2, wherein the shift amount of a stripe after writing the kth stripe is WN.

4. A charged particle beam writing apparatus comprising:

a writer writing a pattern sequentially on each of a plurality of stripes split from a writing area of a substrate in a predetermined width while continuously moving the substrate in a predetermined direction; and a controller controlling the writer S times (S is an integer greater than or equal to two) to perform strokes, each of the strokes which is a process writing the stripes in a multiplicity of 2n (n is an integer greater than or equal to one) while shifting a reference point of each stripe in the width direction by a preset shift amount and changing a moving direction of the substrate for each of the stripes, and to write while the reference point of the stripes in each of the strokes in the width direction of the stripes is shifted by the preset stroke shift amount in each stroke, wherein, when a pattern is written at a multiplicity of N (N is an integer greater than or equal to 2n+1), S=N−(2n−1).

5. The apparatus according to claim 4, wherein when n=1, the preset stripe shift amount after writing a kth (k is an odd number greater than or equal to 1) stripe is less than the stripe width W, and the preset stripe shift amount after writing a (k+1)th stripe is greater than or equal to W.

6. The apparatus according to claim 5, wherein the preset stripe shift amount after the writing process of the kth stripe is W/N.

* * * * *